United States Patent
Nice et al.

(10) Patent No.: US 6,891,325 B1
(45) Date of Patent: May 10, 2005

(54) METHOD OF PRODUCING AN ORGANIC LIGHT-EMISSIVE DEVICE

(75) Inventors: Christopher G. Nice, Histon (GB); Christopher J. Bright, St Ives. Huntingdon (GB)

(73) Assignee: Cambridge Display Technology Limited, Cambridge (GB)

(*) Notice: Subject to any disclaimer, the term of this patent is extended or adjusted under 35 U.S.C. 154(b) by 147 days.

(21) Appl. No.: 10/130,772

(22) PCT Filed: Nov. 22, 2000

(86) PCT No.: PCT/GB00/04441

§ 371 (c)(1),
(2), (4) Date: Aug. 13, 2002

(87) PCT Pub. No.: WO01/39287

PCT Pub. Date: May 31, 2001

(30) Foreign Application Priority Data

Nov. 6, 1999 (GB) .............................................. 9928014

(51) Int. Cl.[7] .............................. H01J 1/62; H01J 63/04
(52) U.S. Cl. ....................... 313/504; 313/506; 313/512; 428/690; 427/77; 427/78; 445/24; 216/5; 216/24
(58) Field of Search ................................. 313/504, 501, 313/503, 506, 512; 428/690; 427/77, 78, 66; 445/24, 25; 216/5, 24

(56) References Cited

U.S. PATENT DOCUMENTS 6,559,593 B1 * 5/2003 Heeks et al. ................. 313/506
6,592,969 B1 * 7/2003 Burroughes et al. ........ 428/332

FOREIGN PATENT DOCUMENTS

| EP | 0 847 094 | 6/1998 |
| JP | 11-074084 | 3/1999 |
| WO | 97-48139 | 12/1997 |

OTHER PUBLICATIONS

Sturm, J C et al., "Patterning Approaches and System Power Efficiency Considerations for Organic LED Displays", Organic Light–Emitting Materials and Devices II, San Diego, CA, USA, Jul. 21–23, 1998.
International Search Report—PCT/GB00/04441, ISA/EPO, Mar. 7, 2001.

* cited by examiner

Primary Examiner—Joseph Williams
Assistant Examiner—Kevin Quarterman
(74) Attorney, Agent, or Firm—Harness Dickey & Pierce P.L.C.

(57) ABSTRACT

The use of a mixture comprising reactive oxygen species and reactive fluorine and/or chlorine species in the production of an organic light-emissive device, comprising an organic light emissive region provided between two electrodes such that charge carriers can move between the electrodes and the organic light emissive region, for etching the organic light-emissive region.

10 Claims, 3 Drawing Sheets

METHOD OF PRODUCING AN ORGANIC LIGHT-EMISSIVE DEVICE

The present invention relates to a method for producing an organic light-emissive device.

Organic light-emissive devices typically comprise an organic light-emissive region located between two electrodes such that charge carriers can move between the electrodes and the organic light-emissive region to stimulate the organic light-emissive region to emit light. The organic light-emissive region often comprises organic layers which function as charge carrier transport layers in addition to one or more layers of organic light-emissive material. Organic light-emissive devices comprising polymer layers are of particular interest because of the intrinsic excellent processability of polymers.

It is sometimes required, in the production of the organic light-emissive device, to etch portions of the organic light-emissive region for patterning the light-emissive region or other purposes.

According to a first aspect of the present invention, there is provided the use of a gas mixture comprising reactive oxygen species and reactive fluorine and/or chlorine species in the production or an organic light-emissive device, comprising an organic light-emissive region provided between two electrodes such that charge carriers can move between the electrodes and the organic light-emissive region, for etching the organic light-emissive region.

The mixture comprising reactive oxygen species (i.e. oxygen radicals or ions) and reactive fluorine and/or chlorine species (i.e. fluorine and/or chlorine radicals or ions) can, for example, be provided by forming a plasma from a gas mixture of oxygen and a compound which comprises fluorine and/or chlorine and dissociates to form reactive fluorine and/or chlorine species under plasma conditions. Examples of suitable compounds include compounds having fluorine and/or chlorine bonded to carbon or silicon. Specific examples include carbon tetrafluoride and silicon tetrachloride. Carbon tetrafluoride is particularly preferred.

According to a second aspect of the present invention, there is provided a method of producing an organic light-emissive device comprising the steps of:
providing a substrate comprising a first electrode;
forming an organic light-emissive region on a first surface of the substrate such that charge carriers can move between the first electrode and the organic light-emissive region;
forming a second electrode on a surface of the organic light-emissive region opposite the first electrode such that charge carriers can move between the second electrode and the organic light-emissive region; and
removing one or more unwanted portions of the organic light-emissive region by etching using a mixture comprising reactive oxygen species and reactive fluorine and/or chlorine species.

Figure 1A:
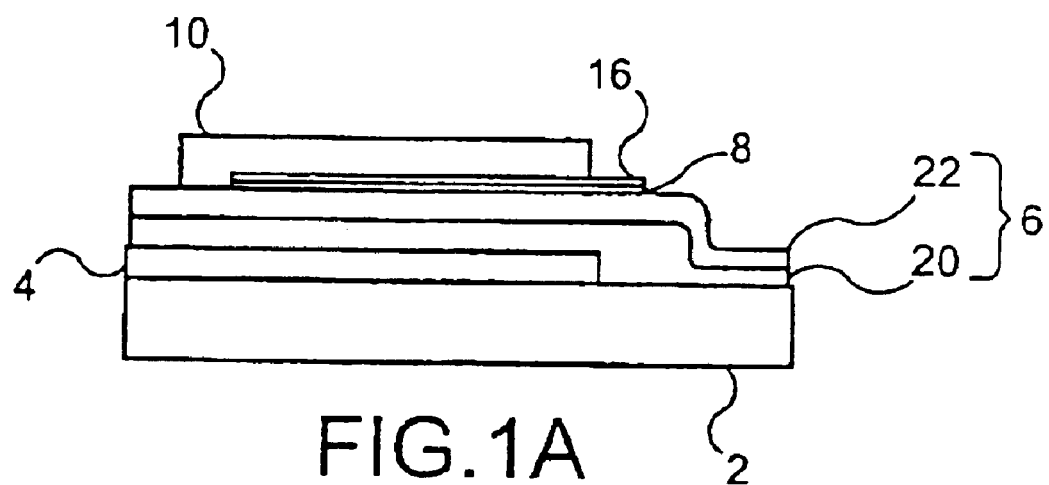
Figure 1B:
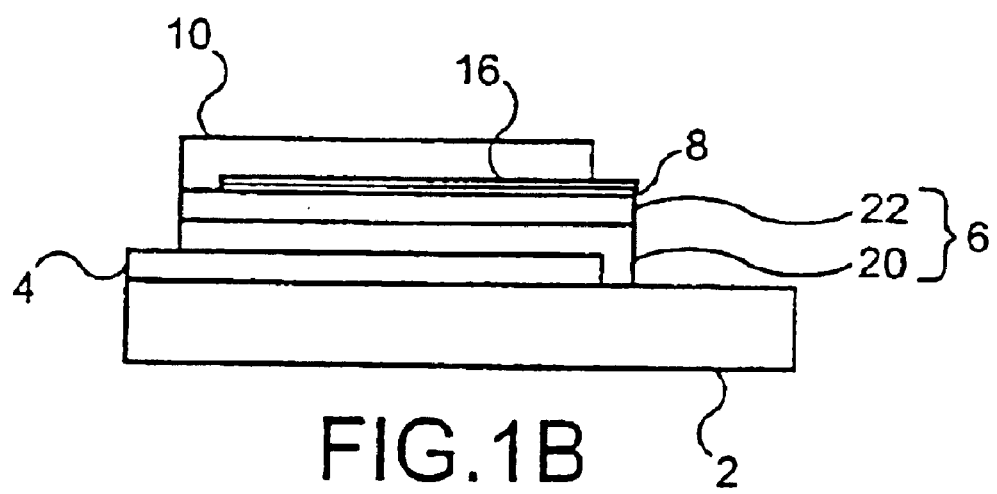
Figure 1C:
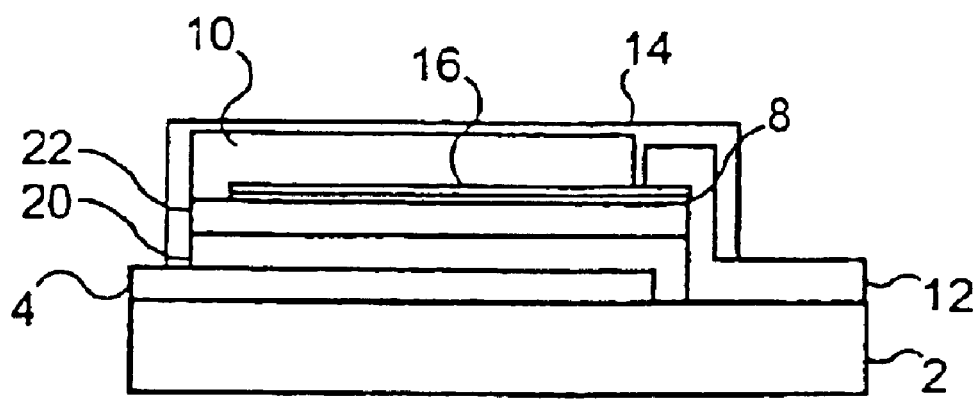
Figure 1D:
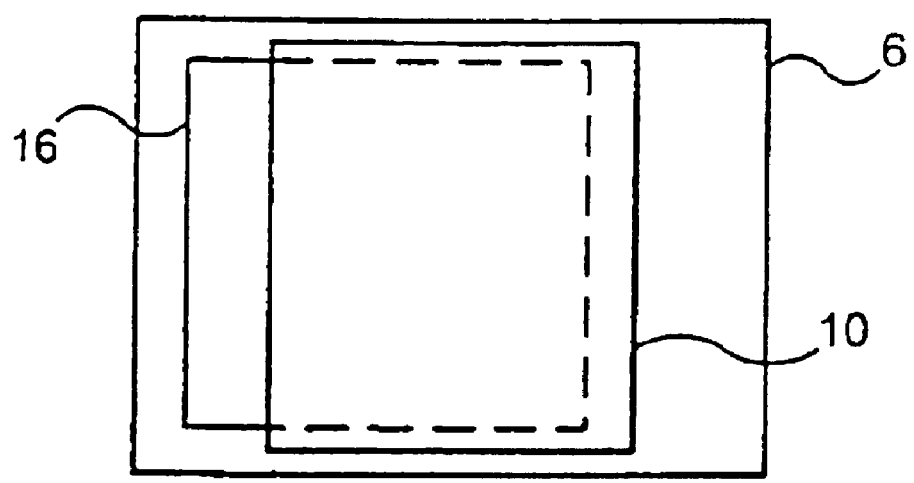
Figure 2A:
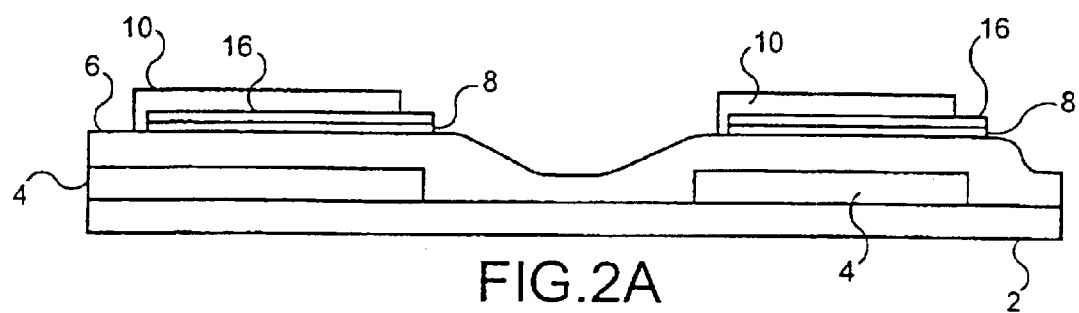
Figure 2B:
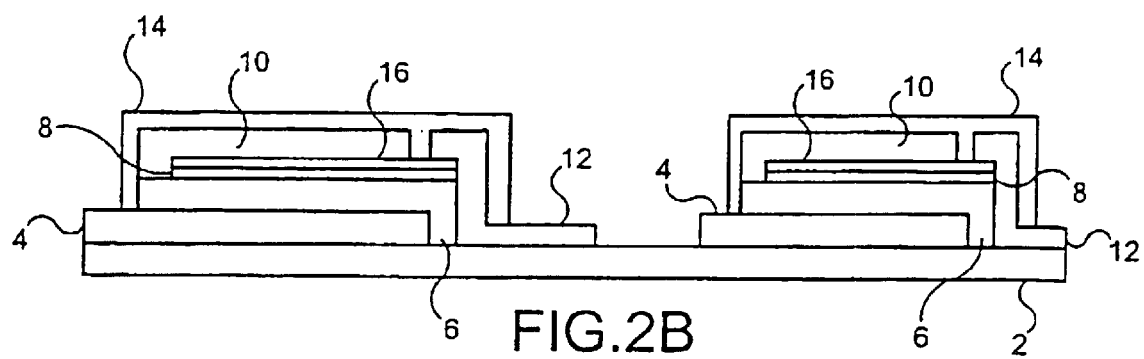

An embodiment of the present invention will be described hereunder, by way of example only, with reference to the accompanying-drawings, in which:

FIGS. 1(a) to 1(c) are schematic cross-sectional views showing the various stages of production of an organic light-emissive device according to an embodiment of the method of the present invention, and FIG. 1(d) is a schematic plan view of the device at the stage shown in FIG. 1(a); and FIGS. 2(a) and 2(b) are schematic cross-sectional views showing the production of a multi-cathode organic light-emissive device according to an embodiment of the method of the present invention.

With reference to FIG. 1(a), a glass base 2 is coated with a layer of indium tin oxide (ITO) as an anode layer 4 to provide an inorganic substrate. An organic light-emissive region 6 is provided on the substrate (comprising the glass base 2 and anode layer 4) by the successive deposition by a standard coating method such as, but not limited to, blade coating, spin coating or ink-jet printing, of a layer 20 of polystyrene sulphonic acid-doped polyethylene dioxythiophene(PEDOT-PSS) as a hole transport layer and a layer 22 comprising one or more light-emissive polymers such as poly(p-phenylenevinylene) ("PPV"), poly(2-methoxy-5(2-ethyl)hexyloxyphenylenevinylene) ("MEH-PPV"), polyfluorenes and/or co-polymers incorporating polyfluorene segments, PPVs and related co-polymers such as poly(2,7-(9,9-di-n-octylfluorene)-(1,4-phenylene-((4-secbutylphenyl)imino)-1,4-phenylene)) ("TFB"), poly(2,7-(9,9-di-n-octylfluorene)-(1,4-phenylene-((4-methylphenyl)imino)-1,4-phenylene-((4-methylphenyl)amino)-1,4-phenylene)) ("PFM"), poly(2,7-(9,9-di-n-octylfluorene)-(1,4-phenylene-((4-methoxyphenyl) imino)-1,4-phenylene-((4-methoxyphenyl)imino)-1,4-phenylene)) ("PFMO"), poly (2,7(9,9-di-n-octylfluorene) ("FB") or (2,7-(9,9-di-octylfluorene)-3,6-Benzothiadiazole) ("FBBT") Alternatively, the light-emissive region may comprise a layer of a small molecule light-emissive material such as Alq3.

Next, a cathode such as a layer of calcium is deposited by, for example, vacuum evaporation on a selected portion of the upper surface of the organic light-emissive region 6 using a shadow mask to provide a cathode layer 8. Other layers comprising a low work function element such as lithium or lithium fluoride can be used instead of a layer of calcium. A capping layer 16 of a relatively unreactive metal such as aluminium is then deposited on top of the cathode layer 8 to protect the cathode and provide a low resistance path.

A protective layer 10 is then selectively deposited on the cathode layer 8 using a shadow mask such that, as shown clearly in FIG. 1(d), it covers a first portion of the upper surface of the capping layer 16 but leaves a second portion of the upper surface of the capping layer 16 uncovered, and also covers the portion of the upper surface of the light-emissive region 6 directly adjacent the portion of the cathode layer 8 beneath the first portion of the capping layer 16. The protective layer 10 is preferably deposited by vacuum evaporation. The thickness of the protective layer is selected such that it still has a sufficient thickness after the subsequent etching step. The primary purpose of the protective layer is to protect at least a portion of the light-emissive region 6 which interfaces with the cathode layer 8 during etching to ensure a good organic region/cathode interface in the final device. One portion of the cathode layer 8 is left exposed to provide an area for connecting to an electrical contact in the final device, as discussed later. The protective layer is preferably made of a relatively inert material such as silicon monoxide layer which is substantially resistant to the etching. A layer of silicon monoxide is used in this embodiment.

With reference to FIG. 1(b), the structure shown in FIG. 1(a) is then placed in a standard R.F. barrel asher connected to an oxygen and a carbon tetrafluoride supply. The structure is then subjected to plasma etching in the barrel asher under the following conditions:
Gas Mixture: 0.5–2% $CF_4$ in oxygen
Pressure: 1.5 mTorr
Barrel Size: 300 mm diameter; 450 mm depth
Power: 400 .

The plasma etching is continued until the portions of the organic light-emissive region at the edges of the device, i.e. the portions of the light-emissive region 6 surrounding the area covered by the cathode layer 8 or the protective layer 10, are removed to expose the underlying substrate (i.e. glass base 2 and anode layer 4), as shown in FIG. 1(b). Under the above conditions, this usually takes about 10 minutes. The silicon monoxide protective layer 10, capping layer and the cathode layer 8 are relatively unaffected by the etching and remain in the device after etching as shown in FIG. 1(b).

With reference to FIG. 1(c), the resulting structure shown schematically I—FIG. 1(b) is then provided with an electrical contact 12 such as an aluminium contact on the glass base 2 and the capping layer 16 to connect the cathode 8 (via the capping layer 16) to an external drive means (not shown). A barrier layer 14 is then provided over the cathode layer 8 and silicon monoxide protective layer 10 such that the barrier layer 14 overlaps the exposed portion of the substrate (and electrical contact 12 in a localised area) thereby effectively encapsulating the light-emissive organic region 6 and the second electrode layer between the barrier layer 14 and the substrate. This encapsulation serves to prevent ambient active species from ingressing into the organic light-emissive region, and diffusing to the cathode interface.

The barrier layer 14 can, for example, be provided by a sputtered metal or dielectric layer, an epoxy or glass edge seal, a glass or metal can, or a glass sheet with an adhesive such as epoxy resin or UV setting adhesive.

The use of a gas mixture comprising reactive oxygen species and reactive fluorine and/or chlorine species is particularly effective in the above-described production of an encapsulated device for the reasons discussed below. The cathodes of organic light-emissive devices which contact the organic light-emissive region usually comprise a low work function metal such as calcium as a result of their excellent electron-injecting performance. However, these low work function elements also have the intrinsic property of being extremely reactive with ambient species such as water and oxygen, and any such reaction of the cathode at the interface with the organic light-emissive region has a detrimental effect on the electron-injecting performance of the cathode resulting in black spots when the device is in operation. It has been observed that the degradation of the cathode interface is largely caused by reactive ambient species diffusing through the organic light-emissive region. It is therefore important to hermetically seal the organic light-emissive region between the first and second electrodes by means of an encapsulating barrier layer(s).

To provide good encapsulation in the structure described above, it is important to cleanly remove all the organic material from the surface of the substrate on which the encapsulating barrier layer(s) is to be deposited. The use of a gas mixture comprising reactive oxygen species and reactive fluorine and/or chlorine species for etching the organic light-emissive region effectively removes the organic material from the surface of the device substrate thereby providing a clean surface for the subsequent deposition of the encapsulating barrier layer(s).

An embodiment of the method of the present invention has been described above for the simplest type of device comprising a single cathode, such as an unpatterned backlight device. However, the method of the present invention is not limited in its application to such simple devices. For example, it is also applicable to devices comprising a patterned array of a plurality of cathodes such as a passive matrix display device or patterned backlight device comprising an array of parallel cathode rows or columns or an active matrix pixel display device comprising an array of pixel cathodes.

A device having a plurality of cathode layers is shown schematically in FIG. 2(b), and an intermediate stage of its production by an embodiment of the method of the present invention is shown in FIG. 2(a).

With reference to FIG. 2(a), the device is produced in the same way as described above for the device shown in FIG. 1(c), except that two cathode layers and capping layers 8, 16 are selectively deposited on portions of the organic light-emissive region 6, and protective layers 10 are selectively deposited on first portions of the upper surface of the two capping layers 16, respectively, to produce the structure shown in FIG. 2(a).

Etching is carried out in the same way as described above for the single cathode device to remove portions of the organic light-emissive region which in the plane of the device surround the respective cathode layer 8 and protective layer 10, and expose the underlying substrate. Aluminium contacts 12 are then provided, and barrier layers 14 are then deposited over the cathode layers 8, protective layers 10 and contacts 12 such that the barrier layer 14 directly overlaps with the exposed portions of the substrate to thereby encapsulate the cathode layers 8 and the remaining portions of the organic light-emissive region 6 between the inorganic substrate and the barrier layer 14.

This encapsulation of the individual portions of the organic light-emissive-regions, and hence the ability to effectively remove the appropriate areas of the organic light-emissive region to cleanly expose the surface of the underlying substrate, has particular significance in the multicathode device, since the isolation of each portion of the organic light-emissive regions means that even if one of the portions of the organic light-emissive region somehow manages to become permeated by ambient active species, the diffusion of such active species throughout the entire device is prevented by the barrier layers 14, thereby limiting damage to a single portion of the organic light-emissive region.

It will be clear to the skilled person as to how the above-described method can be modified for the production of devices comprising a more complicated array of a plurality of cathodes.

What is claimed is:

1. The use of a mixture comprising reactive oxygen species and reactive fluorine and/or chlorine species in the production of an organic light-emissive device, comprising an organic light-emissive region including a polymer layer and provided between two electrodes such that charge carriers can move between the electrodes and the organic light-emissive region, for etching the polymer layer of the organic light-emissive region.

2. The use of a mixture comprising reactive oxygen species and reactive fluorine and/or chlorine species according to claim 1 wherein the polymer is polystyrene sulphonic acid-doped polyethylene dioxythiophene.

3. A method of producing an organic light-emissive device comprising the steps of:

providing a substrate comprising a first electrode;

forming an organic light-emissive region on a first surface of the substrate such that charge carriers can move between the first electrode and the organic light-emissive region, the organic light-emissive region including a polymer layer; forming a second electrode on a surface of the organic light-emissive region opposite the first electrode such that charge carriers can move between the second electrode and the organic light-emissive region; and removing one or more unwanted portions of the organic light-emissive region including the polymer layer by etching using a mixture comprising reactive oxygen species and reactive fluorine and/or chlorine species.

4. The method according to claim 3 wherein the step of forming the second electrode on a surface of the organic light-emissive region is carried out before the step of removing unwanted portions of the organic light-emissive region.

5. The method according to claim 3 or claim 4 wherein the step of removing one or more unwanted portions of the organic light-emissive region comprises removing a periphery portion of the organic light-emissive region to expose a first portion off the first surface of the substrate, the remaining portion of the organic light emissive region defining thereunder a second portion of the first surface of the substrate, wherein the first portion of the first surface of the substrate encircles the second portion of the first surface of the substrate.

6. The method according to claim 5 further comprising the step of providing one or more barrier layers over the portion of the organic light-emissive region left remaining on the substrate and on the second portion of the first surface of the substrate to thereby encapsulate the portion of the organic light-emissive region left remaining on the substrate between the substrate and the encapsulating layer.

7. The method according to claim 4 further comprising the step of forming, prior to etching, a protective layer over the second electrode layer such that it covers a portion of the organic light-emissive region directly adjacent the second electrode layer.

8. The method according to claim 7 wherein the protective layer is formed only over a first portion of the second electrode layer leaving a second portion of the second electrode layer exposed, and further comprising the step of forming an electrical contact on the exposed portion of the second electrode layer.

9. The method according to any of claims 3 to 8 wherein the organic light-emissive region comprises a hole transport layer.

10. The method according to claim 9 wherein the hole transport layer comprises polystyrene sulphonic acid-doped polyethylene dioxythiophene.

* * * * *